United States Patent
Oh et al.

(10) Patent No.: US 7,457,599 B2
(45) Date of Patent: Nov. 25, 2008

(54) FREQUENCY TRANSCEIVER FOR CONTROLLING INTERMEDIATE FREQUENCY

(75) Inventors: Kyoo Chang Oh, Daejeon (KR); Sang Man Moon, Daejeon (KR); Hyoun Kyoung Kim, Daejeon (KR); In Kyu Kim, Daejeon (KR); Sang Jong Lee, Daejeon (KR); Tae Sik Kim, Daejeon (KR); Hae Chang Lee, Daejeon (KR); Chan Hong Yeom, Daejeon (KR)

(73) Assignee: Korea Aerospace Research Institute, Yuseoung-gu, Daejeon (KR)

( * ) Notice: Subject to any disclaimer, the term of this patent is extended or adjusted under 35 U.S.C. 154(b) by 725 days.

(21) Appl. No.: 11/026,866

(22) Filed: Dec. 30, 2004

(65) Prior Publication Data

US 2006/0121872 A1 Jun. 8, 2006

(30) Foreign Application Priority Data

Dec. 8, 2004 (KR) .................. 10-2004-0102745

(51) Int. Cl.
*H04B 1/06* (2006.01)
*H04B 7/00* (2006.01)

(52) U.S. Cl. .................. 455/255; 455/318; 455/323; 455/164.2; 455/264

(58) Field of Classification Search ... 455/67.11–67.15, 455/423, 164.1–169.1, 255, 264, 265, 316, 455/318, 323
See application file for complete search history.

(56) References Cited

U.S. PATENT DOCUMENTS

| | | | | |
|---|---|---|---|---|
| 2,881,321 A | * | 4/1959 | Dauksher et al. ............ | 331/161 |
| 3,573,826 A | * | 4/1971 | Fredericks et al. .......... | 342/174 |
| 3,761,835 A | * | 9/1973 | Cook .......................... | 331/1 A |
| 4,453,136 A | * | 6/1984 | Kelland ....................... | 331/1 A |
| 5,107,522 A | * | 4/1992 | Kitayama et al. ........... | 375/344 |
| 5,633,898 A | * | 5/1997 | Kishigami et al. .......... | 375/344 |
| 5,774,800 A | * | 6/1998 | Mori .......................... | 455/255 |
| 6,011,962 A | * | 1/2000 | Lindenmeier et al. ..... | 455/226.1 |
| 6,023,491 A | * | 2/2000 | Saka et al. .................. | 375/326 |
| 6,895,229 B2 | * | 5/2005 | Schetelig et al. .......... | 455/226.1 |
| 6,933,788 B2 | * | 8/2005 | Forrester .................... | 331/1 R |
| 7,084,808 B2 | * | 8/2006 | Ratzel et al. ................ | 342/173 |
| 2003/0199254 A1 | * | 10/2003 | Kusbel ........................ | 455/77 |

* cited by examiner

*Primary Examiner*—Duc M Nguyen
(74) *Attorney, Agent, or Firm*—Volpe and Koenig P.C.

(57) ABSTRACT

There is provided a frequency transceiver for automatically controlling a TX/RX IF signal in a radar or a communication system, which transmits/receives an RF signal. The frequency transceiver includes a local oscillator for oscillating a VHF proportional to a VHF oscillation control voltage, a first IF processor for mixing an external RF signal with the VHF signal oscillated by the local oscillator and converting the RF signal into an IF signal proportional to the VHF signal, a second IF processor for mixing the RF signal oscillated by the RF oscillator with the VHF signal oscillated by the local oscillator, converting the RF signal into an IF signal proportional to the VHF signal, and converting the converted IF signal into a voltage, a control signal generator for generating a control signal to control the VHF signal oscillation of the local oscillator according to an output voltage of the second IF processor, and a VHF oscillation controller for outputting the VHF oscillation control voltage to the local oscillator according to the control signal generated from the control signal generator.

10 Claims, 1 Drawing Sheet

FREQUENCY TRANSCEIVER FOR CONTROLLING INTERMEDIATE FREQUENCY

BACKGROUND ART

1. Field of the Invention

The present invention relates to a frequency transceiver for use in a communication system and a radar for transmitting/receiving an electromagnetic wave, and more particularly, to a frequency transceiver for automatically controlling a receive intermediate frequency (RX IF).

2. Description of the Related Art

A magnetron is a device that generates a super high frequency by using a high voltage applied from an exterior. In general, the magnetron is classified into a magnetron that generates a 2450-MHz high frequency used in a medical treatment, a microwave oven or other heaters and a magnetron that generates a 915-MHz high frequency used in an industrial heater and a continuous wave radar.

In such a magnetron, a cylindrical anode body is formed of a copper pipe or the like and a cavity resonator is disposed to maintain a radio frequency (RF) component within the cylindrical anode body. An anode section is formed by a plurality (generally, even number) of vanes arranged radially at regular intervals. A filament is arranged along a central axis of the anode body to form an activating space between the vanes and emits thermoelectrons. A pair of permanent magnets are arranged at external upper and lower sides of the activating space, with the activating space being interposed, and forms a magnetic field.

An upper shield hat and a lower shield hat are respectively arranged at upper and lower ends of the filament so as to shield the activating space. A center lead is extended along a central axis of the filament at a central region of the upper shield hat and passes through the lower shield hat, such that the center lead is extended to an outside of the activating space. A side lead is connected to the lower shield hat.

Meanwhile, if an external power is supplied, the filament is heated and thus thermoelectrons are emitted from the heated filament. The emitted thermoelectrons turn toward the vanes. At this point, since DC magnetic field intensities are different and/or the activating space is not perfectly vacuumized, a gas remaining in the activating space collides with the thermoelectrons emitted from the filament, thus generating a vibration and a noise.

In order to suppress the noise, a filter is connected to the center lead and the side lead. The filter is configured with a high-voltage cylindrical condenser and first and second choke coils. The high-voltage cylindrical condenser is connected to an external power terminal. The first choke coil has one end connected to the center lead and the other end connected to the cylindrical condenser, and the second choke coil has one end connected to the side lead and the other end connected to the cylindrical condenser.

The above-described magnetron is widely used as an RF oscillator in the radar and the like. However, the characteristics of the magnetron, such as an oscillation frequency of an RF signal, may be changed due to temperature, humidity and/or heat.

In various communication systems, such as a radar using an RF signal, a transmit/receive (TX/RX) RF signal may also be changed due to a surrounding environment. Therefore, a frequency of an RX IF signal generated from the changed RF signal is also changed and thus the RX IF signal cannot be constantly detected.

SUMMARY OF THE INVENTION

An object of the present invention is to provide a frequency transceiver capable of constantly maintaining an RX IF signal in a radar or a communication system, which transmits/receives an RF signal.

Another object of the present invention is to provide a frequency transceiver, in which an IF signal can be constantly maintained by automatically adjusting a TX/RX IF signal in a radar or a communication system, even when an RX RF signal is oscillated due to a surrounding environment.

A further another object of the present invention is to provide a frequency transceiver, in which a frequency signal received from an exterior can be correctly detected by constantly maintaining an IF signal regardless of a change of a TX/RX RF signal in a radar and the like.

According to one aspect of the present invention, there is provided a frequency transceiver for transmitting an RF signal oscillated from an RF oscillator to an exterior and converting an external RF signal into an IF signal. The frequency transceiver includes: a local oscillator for oscillating a VHF (very high frequency) signal proportional to a VHF oscillation control voltage; a first IF processor for mixing an external RF signal with the VHF signal oscillated by the local oscillator to convert the RF signal into an IF signal proportional to the VHF signal; a second IF processor for mixing the RF signal oscillated by the RF oscillator with the VHF signal oscillated by the local oscillator, converting the RF signal into an IF signal proportional to the VHF signal, and converting the converted IF signal into a voltage; a control signal generator for generating a control signal to control the VHF signal oscillation of the local oscillator according to an output voltage of the second IF processor; and a VHF oscillation controller for outputting the VHF oscillation control voltage to the local oscillator according to the control signal generated from the control signal generator.

BRIEF DESCRIPTION OF THE DRAWINGS

The above objects and other advantages of the present invention will become more apparent by describing in detail preferred embodiments thereof with reference to the attached drawing in which.

DETAILED DESCRIPTION OF THE PREFERRED EMBODIMENT

Figure 1:
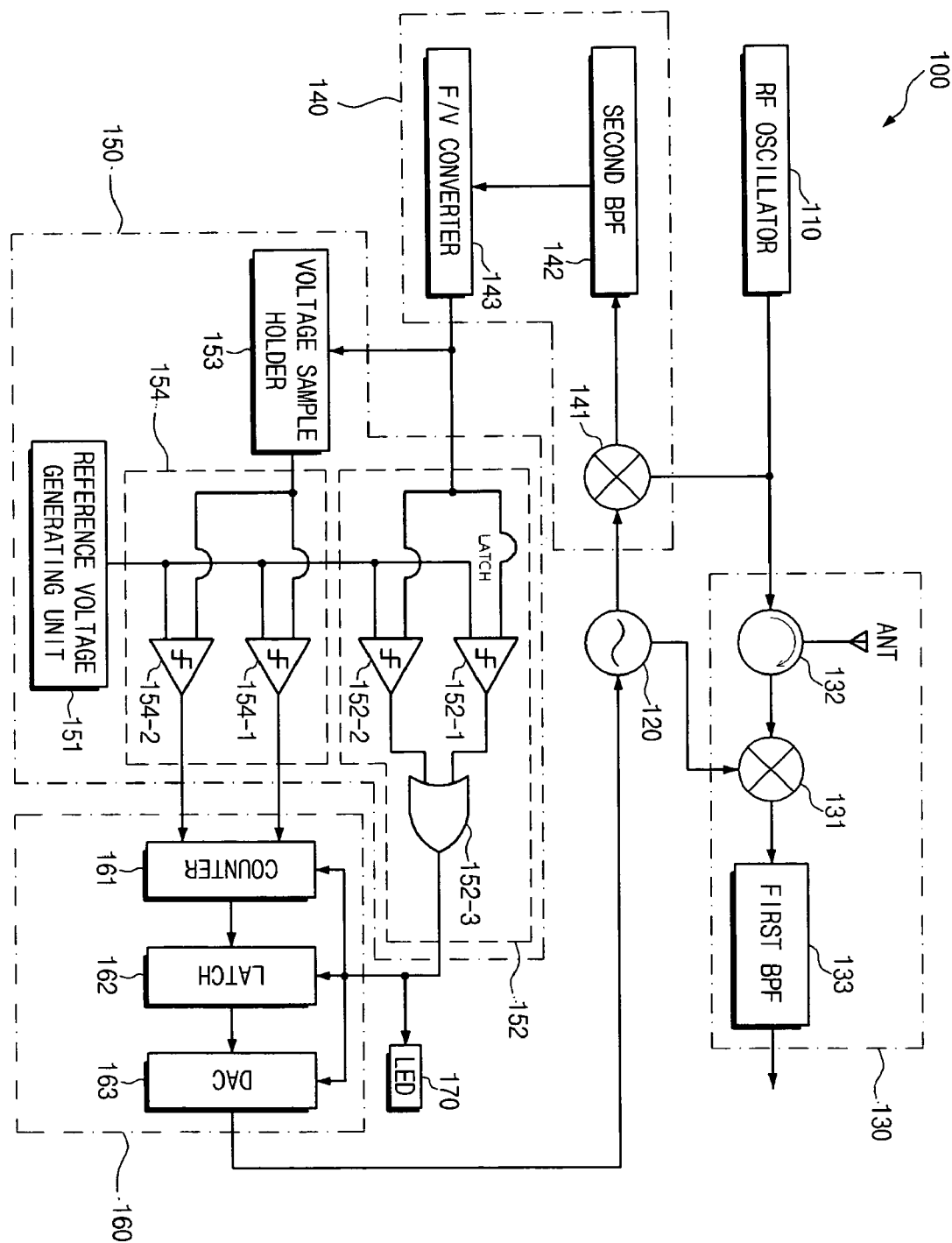
FIG. 1 illustrates a structure of a frequency transceiver for controlling an intermediate frequency according to an embodiment of the present invention.

Now, preferred embodiments of the present invention will be described in detail with reference to the accompanying drawings.

FIG. 1 illustrates a structure of a frequency transceiver for controlling an intermediate frequency according to a preferred embodiment of the present invention.

Referring to FIG. 1, the frequency transceiver includes an RF oscillator 110 for oscillating an RF signal, a local oscillator 120 for oscillating a very high frequency (VHF) signal proportional to a VHF oscillation control voltage, a first IF processor 130 for mixing an external RF signal with the VHF signal oscillated by the local oscillator 120 to convert the RF signal into an IF signal proportional to the VHF signal, a second IF processor 140 for mixing the RF signal oscillated by the RF oscillator 110 with the VHF signal oscillated by the local oscillator 120, converting the RF signal into an IF signal proportional to the VHF signal, and converting the converted IF signal into a voltage according to a frequency, a control signal generator 150 for generating a control signal to control the VHF signal oscillation of the local oscillator 120 according to an output voltage of the second IF processor 140, and a VHF oscillation controller 160 for outputting the VHF oscillation control voltage to the local oscillator 120 according to the control signal from the control signal generator 150.

Also, the frequency transceiver further includes a light emitting diode (LED) 170 for emitting a light according to the control signal from the control signal generator 150 so as to inform that the IF control is carried out by the VHF oscillation controller 160.

If an external voltage is applied, the RF oscillator 110 oscillates the RF signal having a predetermined frequency, which is arbitrarily controlled by the voltage. That is, if the voltage applied to the RF oscillator 110 is turned on/off, a pulse width of the RF signal is changed according to an on/off period of the voltage and the frequency is changed according to the applied voltage. If the external voltage is continuously applied, the RF oscillator 110 oscillates the RF signal having a predetermined pulse width, and the frequency is determined by a predefined voltage and is oscillated. At this point, even at the same voltage, the frequency may be changed or vibrated by itself, depending on an external environment. Such an oscillated RF signal is transmitted through an antenna to an exterior. During the RF oscillation, a small amount of the RF signal is sampled and inputted to the second IF processor 140. The RF oscillator 110 can be implemented with a magnetron that is generally used in a radar.

If the VHF oscillation control voltage is not outputted from the VHF oscillation controller 160, the local oscillator 120 oscillates a predetermined VHF signal and outputs it to the first and second IF processors 130 and 140. On the contrary, if the VHF oscillation control voltage is inputted from the VHF oscillation controller 160, the local oscillator 120 oscillates the VHF signal proportional to the VHF oscillation control voltage. The VHF signal from the local oscillator 120 is used in the first and second IF processors 130 and 140 to convert the RF signal into the IF signal. Therefore, the IF signals generated from the first and second IF processors 130 and 140 are changed according to the VHF signal.

The first IF processor 130 includes a first mixer 131 for mixing the VHF signal from the local oscillator 120 with the RF signal received through the antenna to convert the RF signal into the IF signal, a circulator 132 for transmitting the RF signal oscillated by the RF oscillator 110 to the antenna and transmitting the RF signal received through the antenna to the first mixer 131, and a first band pass filter (BPF) 133 for filtering the IF signal outputted from the first mixer 131 and passing only an IF band signal.

The first mixer 131 converts the external RF signal into the IF signal and outputs the IF signal to the first BPF 133. At this point, the first mixer 131 converts the RF signal into the IF signal in proportion to the VHF signal oscillated by the local oscillator 120. Like this, the IF signal is changed by the VHF signal. Accordingly, regardless of the change in the RF signal received from an exterior, the frequency of the IF signal that is changed by the first mixer 131 can be constantly maintained by automatically controlling the VHF signal oscillated by the local oscillator 120.

The circulator 132 is a device for transmitting an input signal to other peripheral devices and includes a plurality of I/O ports (not shown). The circulator 132 transmits the RF signal oscillated by the RF oscillator 110 to the antenna and transmits the external RF signal received through the antenna to the first mixer 131.

The first BPF 133 eliminates a signal component except the IF band signal outputted from the first mixer 131 and passes only the desired IF signal. At this point, the IF signal filtered by the first BPF 133 is inputted to other devices installed in the radar or the communication system. For example, the IF signal filtered by the first BPF 133 is inputted to a signal detector (not shown) of the radar.

The second IF processor 140 includes a second mixer 141 for mixing the VHF signal oscillated by the local oscillator 120 with the RF signal of a sampled power of the RF oscillator 110 to convert the RF signal into the IF signal, a second BPF 142 for filtering the IF signal outputted from the second mixer 141 and passing only the IF band signal, and a FN converter 143 for converting the IF signal passing through the second BPF 142 into a corresponding voltage.

The second mixer 141 receives a small amount of power during the RF oscillation of the RF oscillator 110, mixes the inputted RF signal with the VHF signal oscillated by the local oscillator 120 to convert the RF signal into the IF signal. Since the sampled power is substantially a power oscillated by the RF oscillator 110, the RF signal of the sampled power has a different power magnitude from the RF signal of the power transmitted through circulator 132 to the antenna, but has the same frequency and pulse characteristic as the RF signal of the transmitted power.

The surrounding environment, such as temperature and humidity, influences the RF oscillator 110. Thus, the RF signal received through the antenna is also influenced according to the surrounding environment and the characteristic of a control RF oscillation driver (not shown). For this reason, the characteristic of the RF signal received from an exterior may be abnormally changed depending on the surrounding environment. If the received RF signal is changed, the IF signal that is changed by the first mixer 131 is also changed and thus the received frequency signal cannot be correctly detected at the radar and the like. In order to solve these problems, even when the received RF signal is changed by the surrounding environment, the present invention automatically controls the VHF signal oscillated by the local oscillator 120 and always constantly maintains the frequency of the IF signal outputted from the first mixer 131.

The oscillation of the VHF signal can be automatically controlled because the characteristic of the RF signal contained in the sampled power of the RF oscillator 110 is substantially almost equal to the characteristics of the RF signals contained in the transmitted power and the received power. The received IF signal changed by the first mixer 131 can be always constantly maintained by automatically controlling the VHF signal that is oscillated in proportion to the RF signal of the sampled power by the local oscillator 120.

The second BPF 142 eliminates a signal component except the IF band signal outputted from the second mixer 141 and outputs the desired IF signal to the F/V converter 143. The F/V converter 143 converts the IF signal passing through the second BPF 142 into a voltage and outputs the voltage to the control signal generator 150. At this point, the output voltage of the F/V converter 143 is proportional to the frequency of the IF signal. For example, if the RF signal of the power sampled from the RF oscillator 110 is shifted from a frequency of a predetermined RF signal, a frequency of the IF signal changed in proportion to the RF signal of the sampled power by the second mixer 141 is also shifted. Therefore, the output voltage of the F/V converter 143 becomes larger or smaller than the voltage when the predetermined RF signal is oscillated. In this manner, the second IF processor 140 detects the RF signal of the power sampled from the RF oscillator 110 and then the voltage proportional to the frequency of the detected RF signal is outputted. The control signal generator 150 compares the voltage with an internal reference voltage, controls a driving of the VHF oscillation controller 160 according to the comparison result, and constantly maintains the frequency of the received IF signal generated from the first mixer 131.

The control signal generator 150 includes a reference voltage generating unit 151 for generating the reference voltage used to control the IF signal, a driving control signal generating unit 152 for comparing the output voltage of the F/V converter 143 with the reference voltage outputted from the reference voltage generating unit 151 and generating a driving control signal which controls the driving of the VHF oscillation controller 160 to the VHF oscillation controller 160 according to the comparison result, a voltage sample holder 152 for delaying the output voltage of the F/V converter 143, and a counting control signal generating unit 154 for comparing the delayed voltage with the reference voltage and generating a counting control signal which controls a data counting operation of the VHF oscillation controller 160 to the VHF oscillation controller 160 according to the comparison result.

The reference voltage generating unit 151 generates the reference voltage to first and second comparators. The reference voltage is used to control the frequency of the IF signal that is converted by the first mixer 131. The reference voltage has a preset value, which is determined when it has the same frequency of the most ideal IF signal passing through the first and second BPFs 133 and 142.

That is, in case where the normal IF signal is outputted from the second BPF 142, the reference voltage from the reference voltage generating unit 151 has the same magnitude as the output voltage of the F/V converter 143. It shows that the TX/RX RF signals having the preset frequency are outputted. In this case, the control signal generator 150 disables the operation of the VHF oscillation controller 160, such that the local oscillator 120 oscillates a predetermined VHF without being controlled by the VHF oscillation controller 160.

The driving control signal generating unit 152 includes first and second comparators 152-1 and 152-2 for comparing the output voltage of the F/V converter 143 with the reference voltage and outputting a HIGH signal or a LOW signal according to the comparison result, and an OR gate 152-3 for performing an OR logic operation on the output signals of the first and second comparators 152-1 and 152-2 and outputting an ENABLE signal or a DISABLE signal which controls the driving of the VHF oscillation controller 160 to the VHF oscillation controller 160.

The first and second comparators 152-1 and 152-2 are arranged in parallel and each of them has two input terminals. Here, one input terminal of each comparator is commonly connected to an output terminal of the F/V converter 143, and the other terminal is commonly connected to an output terminal of the reference voltage generator 151.

Each of the first and second comparators 152-1 and 152-2 compares the output voltage of the F/V converter 143 with the reference voltage outputted from the reference voltage generating unit 151. If the two voltages are equal to each other, the comparators 152-1 and 152-2 output LOW signals to the OR gate 152-3. On the contrary, if the two voltages are different from each other, the comparators 152-1 and 152-2 output HIGH signals to the OR gate 152-3.

The OR gate 152-3 has two input terminals. If the OR gate 152-3 receives the LOW signals from the first and second comparators 152-1 and 152-2, the OR gate 152-3 outputs the DISABLE signal and thus the VHF oscillation controller 160 is disabled. On the contrary, if the OR gate 152-3 receives the HIGH signals from the first and second comparators 152-1 and 152-2, the OR gate 152-3 outputs the ENABLE signal and thus the VHF oscillation controller 160 is enabled.

That is, if the RF oscillation 110 is not influenced by the surrounding environment, the IF signal produced by converting the RF signal of the sampled power of the RF oscillator 110 has the normal frequency. Accordingly, the F/V converter 143 converts the normal IF signal into the corresponding voltage. Thus, as described above, the output voltage of the F/V converter 143 has the same magnitude as the reference voltage. It means that the RF signal is normally received through the antenna, and the RX IF signal outputted from the first mixer 131 has the normal frequency. Like this, if the normal frequency is received, the driving control signal generating unit 152 receives the same voltages from the F/V converter 143 and the reference voltage generating unit 151 and outputs the DISABLE signal, such that the driving of the VHF oscillation controller 160 is stopped. Therefore, the local oscillator 120 outputs a predetermined VHF signal to the first and second mixers 131 and 141 without any control of the VHF oscillation controller 160.

If the RF oscillation 110 is influenced by the surrounding environment, the IF signal produced by converting the RF signal of the sampled power of the RF oscillator 110 has the changed frequency, that is, the abnormal frequency. Accordingly, the F/V converter 143 converts the abnormal IF signal into the corresponding voltage. Thus, as described above, the output voltage of the F/V converter 143 has the different magnitude from the reference voltage. It means that the RF signal is abnormally received through the antenna due to the influence of the surrounding environment, and the RX IF signal outputted from the first mixer 131 has the frequency different from that of the normal case. Like this, if the abnormal frequency is received, the driving control signal generating unit 152 receives the different voltages from the F/V converter 143 and the reference voltage generating unit 151 and outputs the ENABLE signal, such that the VHF oscillation controller 160 is driven. Therefore, the local oscillator 120 outputs a VHF signal proportional to the output voltage of the VHF oscillation controller 160 to the first and second mixers 131 and 141.

The voltage sample holder 153 sample-holds the frequency-converted voltage generated during the transmission period of the pulse radar, and delays the output voltage of the F/V converter 143 and outputs it to the counting control signal generating unit 154 for comparing a previous transmitted pulse with the reference voltage.

For example, in case where the frequency of the RX IF signal must be adjusted because the TX/RX RF signals has been influenced by the surrounding environment, the output voltage of the F/V converter 143 becomes different from the output voltage of the reference voltage generating unit 151. Thus, the driving control signal generating unit 152 outputs the ENABLE signal to the VHF oscillation controller 160 so that the VHF oscillation controller 160 can adjust the VHF signal outputted from the local oscillator 120. For this reason, the voltage is delayed.

At this point, the VHF oscillation controller 160 outputs a voltage for controlling the local oscillation 120 according to the counting control signal outputted from the counting control signal generating unit 154, or the counting control signal generating unit 154 generates the counting control signal according to the output voltage of the F/V converter 143. Therefore, the output voltage of the F/V converter 143 is applied to the driving control signal generating unit 152 and the counting control signal generating unit 154 in parallel. At this point, the voltage applied to the counting control signal generating unit 154 is delayed through the voltage sample holder 153, such that the previous transmitted pulse and the voltage of the reference voltage generating unit 151 can be compared with each other.

The counting control signal generating unit 154 includes a third comparator 154-1 for comparing the voltage delayed through the voltage sample holder 153 with the reference voltage outputted from the reference voltage generating unit 151 and outputting a counting down signal to the VHF oscillation controller 160 according to the comparison result, and a fourth comparator 154-2 for comparing the voltage delayed through the voltage sample holder 153 with the reference voltage outputted from the reference voltage generating unit 151 and outputting a counting up signal to the VHF oscillation controller 160 according to the comparison result.

The third and fourth comparators 154-1 and 154-2 are arranged in parallel and each of them has two input terminals. Here, one input terminal of each comparator is commonly connected to an output terminal of the voltage sample holder 153, and the other terminal is commonly connected to an output terminal of the reference voltage generator 151.

The third comparator 154-1 compares the voltage delayed through the voltage sample holder 153 with the reference voltage. If the reference voltage is smaller than the delayed voltage, the third comparator 154-1 outputs the counting down signal to the VHF oscillation controller 160.

If the counting down signal is outputted from the third comparator 154-1, the VHF oscillation controller 160 is controlled by the counting down signal, so that the local oscillation 120 is controlled to reduce the VHF signal inputted to the first and second mixers 131 and 141. When the TX/RX RF signal becomes larger than the normal frequency due to the surrounding environment, the RX IF signal also becomes larger than the normal frequency. Therefore, the VHF oscillation controller 160 relatively lowers the VHF signal according to the counting down signal, such that the RX IF signal can have the constant frequency.

The fourth comparator 154-2 compares the voltage delayed through the voltage sample holder 153 with the reference voltage. If the reference voltage is larger than the delayed voltage, the fourth comparator 154-2 outputs the counting up signal to the VHF oscillation controller 160.

If the counting up signal is outputted from the fourth comparator 154-2, the VHF oscillation controller 160 is controlled by the counting up signal, so that the local oscillation 120 is controlled to increase the VHF signal inputted to the first and second mixers 131 and 141. When the TX/RX RF signal becomes smaller than the normal frequency due to the surrounding environment, the RX IF signal also becomes smaller than the normal frequency. Therefore, the VHF oscillation controller 160 relatively increases the VHF signal according to the counting up signal, such that the RX IF signal can have the constant frequency.

The VHF oscillation controller 160 includes a counter 161 driven in response to the ENABLE signal outputted from the driving control signal generating unit 152, for counting the predetermined data according to the counting control signal and outputting the counted data value, a latch 162 driven in response to the ENABLE signal, for latching the data outputted from the counter 161, and a digital-to-analog converter (DAC) 163 driven in response to the ENABLE signal, for converting the digital data outputted from the latch 162 into a corresponding voltage, which is an analog signal, and outputting the voltage to the local oscillator 120.

If the counting down signal is inputted from the third comparator 154-1, the counter 161 counts down a predetermined data and outputs the down data to the latch 162. For example, if the counting down signal is inputted one time, a predetermined data is counted down one time, and if the counting down signal is inputted n times, a predetermined data counts down n times. In this manner, if the counter 161 counts down the data, the voltage outputted from the DAC 163 also becomes small in proportion to the down counting number of the counter 161.

If the output voltage of the DAC 163 becomes small, the VHF signal oscillated from the local oscillator 120 also becomes small in proportion to the voltage. Thus, the frequency of the IF signals outputted from the first and second mixers 131 and 141 is changed in proportion to the frequency of the VHF signal.

Like this, the down counting process is carried out so as to compensate for the changed frequency of the RX IF signal when the TX/RX RF signals becomes small due to the surrounding environment.

If the counting up signal is inputted from the fourth comparator 154-2, the counter 161 counts up a predetermined data and outputs the up data to the latch 162. For example, if the counting up signal is inputted one time, a predetermined data is counted up one time, if the counting up signal is inputted n times, a predetermined data is counted up n times. In this manner, if the counter 161 counts up the data, the voltage outputted from the DAC 163 also becomes large in proportion to the up counting number of the counter 161.

If the output voltage of the DAC 163 becomes large, the VHF signal oscillated from the local oscillator 120 also becomes large in proportion to the voltage. Thus, the frequency of the IF signals outputted from the first and second mixers 131 and 141 is changed in proportion to the frequency of the VHF signal.

Like this, the up counting process is carried out so as to compensate for the changed frequency of the RX IF signal when the TX/RX RF signals becomes large due to the surrounding environment.

As described above, the present invention can automatically compensate for the frequency of the RX IF signal, which is changed when the TX/RX RF signal is changed due to the surrounding environment. The present invention can be applied to the radars or various communication systems, which use the RF signal.

If the present invention is applied to the wireless communication system, the RX IF signal or the baseband signal can be correctly detected even when the frequency of the transmitter is changed due to the surrounding environment, thereby providing high quality of the communication service to users.

As described above, regardless of the change of the RF signal, the IF signal can be always constantly maintained in the radar or the communication system by automatically adjusting the RX IF signal. Accordingly, the RX IF signal can be correctly detected.

While the present invention has been described in detail, it should be understood that various changes, substitutions and alterations can be made hereto without departing from the spirit and scope of the invention as defined by the appended claims.

What is claimed is:

1. A frequency transceiver for transmitting an RF (radio frequency) signal oscillated from an RF oscillator to an exterior to convert an external RF signal into an IF (intermediate frequency) signal, the frequency transceiver comprising:
   a local oscillator for oscillating a VHF (very high frequency) signal proportional to a VHF oscillation control voltage inputted;

a first IF processor for mixing an external RF signal with the VHF signal oscillated by the local oscillator to convert the external RF signal into a first IF signal proportional to the VHF signal;

a second IF processor for mixing the RF signal oscillated by the RF oscillator with the VHF signal oscillated by the local oscillator to convert the RF signal into a second IF signal proportional to the VHF signal, and converting the second IF signal into an output voltage;

a control signal generator for generating a control signal which controls VHF signal oscillation of the local oscillator according to the output voltage of the second IF processor, the control signal generator comprising:

a reference voltage generating unit for generating a reference voltage used to control the first IF signal and the second IF signal;

a driving control signal generating unit for comparing the output voltage with the reference voltage and generating a driving control signal;

a voltage sample holder for delaying the output voltage; and a counting control signal generating unit for comparing the delayed output voltage with the reference voltage and generating a counting control signal; and a VHF oscillation controller for outputting the VHF oscillation control voltage to the local oscillator according to the driving control signal and the counting control signal.

2. The frequency transceiver of claim 1, wherein the first IF processor comprises:

a first mixer for mixing the VHF signal from the local oscillator with the external RF signal received from the exterior to convert the external RF signal into the first IF signal; and a first BPF (band pass filter) for filtering the first IF signal outputted from the first mixer and passing only a first IF band signal.

3. The frequency transceiver of claim 1, wherein the second IF processor comprises:

a second mixer for mixing the VHF signal oscillated by the local oscillator with an RF signal of a sampled power of the RF oscillator to convert the RF signal into the second IF signal;

a second BPF (band pass filter) for filtering the second IF signal outputted from the second mixer and passing only a second IF band signal; and a F/V converter for converting the second IF band signal passing through the second BPF into the output voltage.

4. The frequency transceiver of claim 1, wherein the driving control signal generating unit comprises:

a first and a second comparators for comparing the output voltage with the reference voltage to generate first and second comparison results, respectively, and generating a HIGH signal or a LOW signal according to the first and second comparison results; and an OR gate for performing an OR logic operation with output signals of the first and second comparators to output an ENABLE signal or a DISABLE signal to the VHF oscillation controller which controls the driving of the VHF oscillation controller.

5. The frequency transceiver of claim 4, wherein each of the first and second comparators compares the output voltage of the second IF processor with the reference voltage outputted from the reference voltage generating unit, outputs a LOW signal to the OR gate if the two voltages are equal to each other, and outputs a HIGH signal to the OR gate if the two voltages are different from each other.

6. The frequency transceiver of claim 5, wherein the OR gate outputs the DISABLE signal to the VHF oscillation controller if the OR gate receives the LOW signals from the first and second comparators, and outputs the ENABLE signal to the VHF oscillation controller if the OR gate receives the HIGH signals from the first and second comparators.

7. The frequency transceiver of claim 6, wherein the counting control signal generating unit comprises:

a third comparator for comparing the delayed output voltage delayed through the voltage sample holder with the reference voltage outputted from the reference voltage generating unit to generate a third comparison result and outputting a counting down signal to the VHF oscillation controller according to the third comparison result; and a fourth comparator for comparing the delayed output voltage delayed through the voltage sample holder with the reference voltage outputted from the reference voltage generating unit to generate a fourth comparison result and outputting a counting up signal to the VHF oscillation controller according to the fourth comparison result.

8. The frequency transceiver of claim 7, wherein the third comparator outputs a the counting down signal to the VHF oscillation controller if the delayed output voltage delayed through the voltage sample holder is larger than the reference voltage, and the fourth comparator outputs the counting up signal to the VHF oscillation controller if the delayed output voltage delayed through the voltage sample holder is smaller than the reference voltage.

9. The frequency transceiver of claim 7, wherein the VHF oscillation controller comprises:

a counter which is driven in response to the ENABLE signal outputted from the driving control signal generating unit, and counts a predetermined data according to the counting control signal and outputs a counted data value;

a latch which is driven in response to the ENABLE signal, and latches the counted data value outputted from the counter; and a DAC (digital-to-analog converter) which is driven in response to the ENABLE signal, converts an output from the latch into the VHF oscillation control voltage, and outputs the VHF oscillation control voltage to the local oscillator.

10. The frequency transceiver of claim 9, wherein the counter counts down the predetermined data and outputs a down counted data value if a counting up signal is inputted from the fourth comparator, and the counter counts up the predetermined data and outputs a up counted data value if a counting down signal is inputted from the third comparator.

* * * * *